March 10, 1970 J. E. ANNIS 3,500,062

DIGITAL LOGIC APPARATUS

Filed May 10, 1967

| B | A | C |
|---|---|---|
| H | H | H |
| H | L | L |
| L | H | L |
| L | L | H |

| B | A | C |
|---|---|---|
| L | H | H |
| L | L | L |
| H | H | L |
| H | L | H |

INVENTOR
JOSEPH E. ANNIS

BY John V. Regan
ATTORNEY

United States Patent Office 3,500,062
Patented Mar. 10, 1970

3,500,062
DIGITAL LOGIC APPARATUS

Joseph E. Annis, South Weymouth, Mass., assignor to RCA Corporation, a corporation of Delaware

Filed May 10, 1967, Ser. No. 637,413
Int. Cl. H03k *19/20*
U.S. Cl. 307—216 7 Claims

ABSTRACT OF THE DISCLOSURE

Signal powered logic circuit comprised of an insulated gate field-effect transistor (IGFET) inverter and transmission gate for performing INCLUSIVE OR or EXCLUSIVE OR operations and requiring only three input signals, one of which is a complement and which circuit is capable of fabrication as an integrated circuit.

BACKGROUND OF THE INVENTION

Logic circuits capable of performing either the EXCLUSIVE OR and the complement ($\overline{\text{EXCLUSIVE OR}}$) thereof are useful in varied applications. By way of example, EXCLUSIVE OR circuits are useful in adders; while $\overline{\text{EXCLUSIVE OR}}$ circuits are useful in comparison or identity circuits.

The logic circuits of the present invention are readily implemented with solid state elements such as insulated gate field-effect transistors (IGFET's). When the logic circuits are so implemented, only 3 or 4 IGFET's and no passive components are required. This relatively small component count is especially attractive for use in integrated circuit structures wherein chip or substrate area is inversely related to circuit yield; whereby the smaller the area, the higher the circuit yield. Moreover, no connections to the power supply buses are required, thus conserving more chip area.

BRIEF SUMMARY OF INVENTION

According to the examples of the invention, EXCLUSIVE OR/$\overline{\text{EXCLUSIVE OR}}$ logic apparatus includes an inverter and a transmission gate connected between the inverter input and output terminals. Binary signal means applies a binary signal A to the input terminals of both the inverter and the transmission gate; a binary signal B to both a control terminal means of the transmission gate and to a first control terminal of the inverter; and a binary signal $\overline{B}$ to a second control terminal of the inverter. The $\overline{B}$ signal provides operating power for the inverter when the transmission gate is turned off, thus obviating the need for a power supply.

According to the illustrated examples of the invention, the inverter and the transmission gate are implemented by means of IGFET's. Ine one of the examples, requiring only three IGFET's of the same conductivity type, the inverter includes a first common source IGFET having gate and drain electrodes corresponding to the inverter input and output terminals, respectively, and a source electrode corresponding to the first control terminal of the inverter. A series load impedance comprising the source-drain path of a second IGFET is connected between the first IGFET drain electrode and the second control terminal of the inverter. The transmission gate includes a third IGFET having a source-drain path, the ends of which correspond to the input and output terminals of the transmission gate. The gate electrode of the third IGFET corresponds to the control terminal of the transmission gate.

In another of the examples, requiring four IGFET's, the inverter includes a first pair of IGFET's of first and second conductivity types connected in a complementary inverter configuration. That is, their gate electrodes are connected in common to the inverter input terminal and one end of each of their source-drain paths is connected to the output terminal. The other ends of their source-drain paths are connected to different ones of the first and second inverter control terminals. The transmission gate includes a second pair of IGFET's, also the first and second conductivity types having their source-drain paths connected in parallel with one end of the parallel paths corresponding to the transmission gate input terminals and the other end thereof to the transmission gate output terminals. The B and $\overline{B}$ signals are applied to different ones of the control terminals of the complementary transmission gate pair.

DESCRIPTION OF PREFERRED EMBODIMENTS

Figures 1, 2, 3, 4:
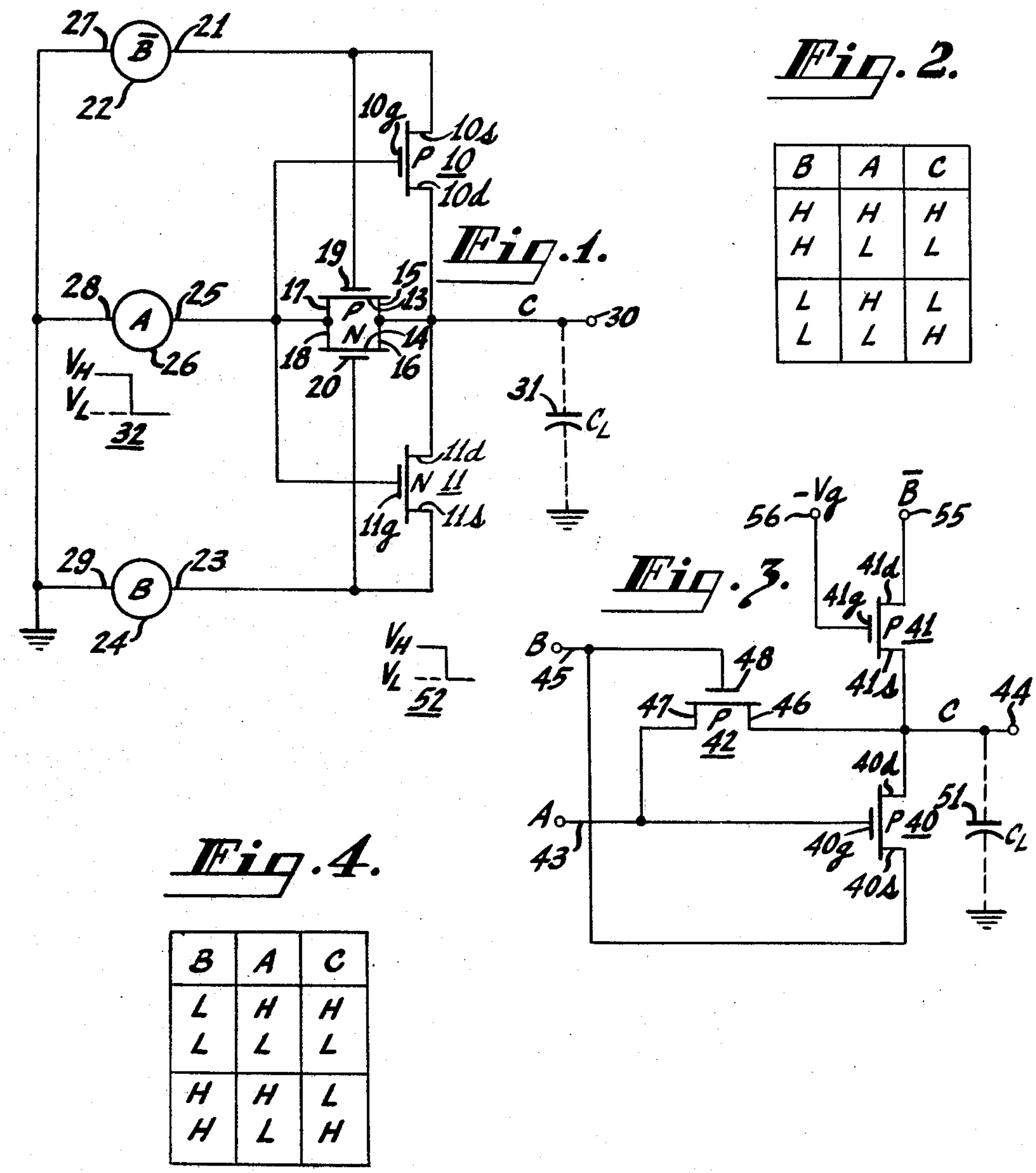
FIG. 1 is a circuit diagram of an exemplary EXCLUSIVE OR/$\overline{\text{EXCLUSIVE OR}}$ circuit in accordance with the present invention.
FIG. 2 is a truth table for the FIG. 1 circuit.
FIG. 3 is a circuit diagram of another embodiment of the invention.
FIG. 4 is a truth table for the FIG. 3 circuit.

An IGFET may generally be defined as a majority carrier field-effect device which includes a body of semiconductor material. A carrier conduction channel within the semiconductive body is bound at one end thereof by a source region and at the other end thereof by a drain region. The gate or control electrode means overlies at least a portion of the carrier conduction channel and is separated therefrom by a region of insulating material. Due to the insulation between the gate electrode and the channel, the input impedance of the IGFET is very large on the order of $10^{15}$ ohms or more, so that substantially no d.c. current flows in the gate electrode circuit. Thus, the IGFET is a voltage controlled device. Signals or voltages applied to the gate electrode means control, by field-effect, the conductance of the channel.

Such transistors may be of either the enhancement type or the depletion type. In a depletion type transistor there is current flow through the conduction channel when the source and gate electrodes have the same voltage ($V_{gs}=0$). This current flow either increases or decreases depending upon the polarity of the applied voltage between the gate and source electrodes. In an enhancement type transistor there is substantially no current flow through the conduction channel until $V_{gs}$ is at least equal in magnitude to the threshold voltage $V_t$ and of the same polarity as the drain-to-source voltage ($V_{ds}$). The enhancement transistor is of particular interest in the practice of my invention.

An IGFET may be either a P-type or an N-type transistor depending upon the majority carriers involved in drain current conduction. A P-type transistor is one in which the majority carriers are holes; whereas an N-type unit is one in which the majority carriers are electrons.

EXCLUSIVE OR/$\overline{\text{EXCLUSIVE OR}}$ logic apparatus according to my invention may be constructed either with discrete components or by means of integrated circuit processes. As used herein, the term, integrated circuit, refers to those technologies by which an entire circuit can be formed as by diffusion or by thin films in or on one or more chips of suitable substrate material. For example, in the case of metal oxide semiconductors (MOS) IGFET's, the substrate material could be silicon; while for the case of thin film IGFET's, the substrate material could be an insulator, such as glass or sapphire. EXCLUSIVE OR/$\overline{\text{EXCLUSIVE OR}}$ circuits according to the present invention may each be fabricated on separate chips or fabricated in combination with other circuitry in or on the same substrate. As the case may be, the integrated circuit structures or chips so formed are useful as building blocks which may be interconnected and combined with appropriate power supplies and signal sources to form various digtal systems.

Referring now to FIG. 1, an example according to the invention includes a P-type IGFET 10 and an N-type IGFET 11 arranged as a complementary inverter pair. To this end the drain electrodes 10*d* and 11*d* are connected in common to an output terminal 30, also designated C. The source electrodes 10*s* and 11*s*, which correspond to inverter control terminals, are connected to the output terminals 21 and 23 of the complementary signal sources 22 and 24, respectively, also designated $\overline{B}$ and B, respectively. The gate electrodes 10*g* and 11*g* are connected in common to the output terminal 25 of another signal source 26, also designated as A. The other terminals 27, 28 and 29 of the signal sources are connected to a point of fixed reference potential, illustrated in FIG. 1 a circuit ground by the conventional symbol therefor.

Another pair of complementary IGFET's 13 and 14 are connected in complementary transmission gate arrangement between the input and output of the complementary inverter pair. To this end P-type IGFET 13 has the output one of its source and drain electrodes 15 connected to the output terminal 30 and the input source-drain electrode 17 connected to the output terminal 25 of the signal A source. The N-type IGFET 14 has the output one of its source and drain electrodes 16 connected to output terminal 30 and the input source-drain electrode 18 connected to the A signal output terminal 25. The control or gate electrodes 19 and 20 are connected to the output terminals 21 and 23 of the $\overline{B}$ and B signal sources.

The C output terminal 30 is shown to be further connected to a load capacitance 31, also designated $C_L$, as illustrated by the dashed connections in FIG. 1. The load capacitance $C_L$, for example, may be representative of the sum total of the input capacitance of other IGFET's which the logic circuit is driving.

The binary signals A, B and $\overline{B}$ have the well-known form of HI and LO voltage levels with transitions therebetween as illustrated by the waveform 32 adjacent the A signal source. As there illustrated, the HI and LO voltage levels are considered to have the values of $V_H$ and $V_L$, respectively. These signals A, B and $\overline{B}$ may be derived, by way of example, from the outputs of other IGFET switching and logic circuits connected in the digital system. The $\overline{B}$ signal may be derived from the B signal by means of an IGFET inverter (not shown).

In the operation of the illustrated example, the HI level signal $V_H$ is assumed to be larger in absolute value than the threshold voltage $V_{TP}$ of any of the P-type IGFET's and the threshold voltage $V_{TN}$ of any of the N-type IGFET's. The low signal level $V_L$ is assumed to be less than $V_{TP}$ and $V_{TN}$ and may conveniently be 0 volt.

When the B and $\overline{B}$ signals are at $V_H$ volts and 0 volt, respectively, the transmission gate IGFET's 13 and 14 are both turned on so that there is a low impedance path between the A signal input and the C signal output. For this signal condition, the C output signal follows the A input signal, i.e., the load capacitance $C_L$ is charged or discharged to the level of the A signal via the source-drain paths of the transmission gate IGFET's. Thus when A is HI, C is HI and when A is LO, C is LO.

When the B and $\overline{B}$ signals are at 0 volt and $V_H$ volts, respectively, the transmission gate IGFET's 13 and 14 are both turned off. With $V_H$ volts at the source electrode 10*s* of P-type IGFET 10 and 0 volt at the source electrode 11*s* of N-type IGFET 11, the complementary inverter pair is conditioned for operation as an inverter. Thus when A is HI, C is LO and when A is LO, C is HI.

This circuit operation is summarized in the truth table shown in FIG. 2, wherein H and L are symbolic of $V_H$ volts and 0 volt, respectively. If the binary symbols "1" and "0" are assigned to the $V_H$ and 0 volt levels, respectively (positive logic), the logic circuit can be said to function as an $\overline{\text{EXCLUSIVE OR}}$ gate which can be expressed in Boolean notation as:

$$C=AB+\overline{A}\overline{B} \qquad (1)$$

on the other hand, if the binary symbols "1" and "0" are assigned to the 0 and $V_H$ volt levels, respectively (negative logic), the logic circuit can be said to function as an EXCLUSIVE OR gate which can be expressed in Boolean notation as:

$$C=A\overline{B}+\overline{A}B \qquad (2)$$

The B and $\overline{B}$ signals could be interchanged so that B is applied to gate electrode 19 and to source electrode 10*s*; while $\overline{B}$ is applied to gate electrode 20 and source electrode 11*s*. In such case, for positive logic the circuit performs the EXCLUSIVE OR function; while for negative logic, the $\overline{\text{EXCLUSIVE OR}}$ function.

The operation of the complementary transmission gate IGFET pair is described in a copending application of Joseph R. Burns and John James Gibson, entitled, Transmission Gate, Ser. No. 515,413, filed, Dec. 21, 1965, now Patent No. 3,457,435, and assigned to the same assignee of the present application. As described therein, the complementary transmission gate is advantageous since for the turned on condition ($B=V_H$ volts, $\overline{B}=0$ volt) and for $A=V_H$ volts, the N-type IGFET 14 operates as a source-follower; while concurrently therewith IGFET 13 operates in the common source mode. The N-type IGFET 14 becomes nonconductive when the charge on load capacitance $C_L$ reaches a value of $V_H-V_{TN}$ volts. However, P-type IGFET 13, operating in the common source mode, continues to be biased on irrespective of the charge on $C_L$. Accordingly, IGFET 13 continues to provide a low impedance path so that $C_L$ becomes charged to $V_H$ volts. Similarly, when A equals 0 volt with the transmission gate turned on, P-type IGFET 13 operates as a source-follower and N-type IGFET operates in the common source mode to permit the full discharging of the load capacitance $C_L$ to 0 volt.

The logic circuit described in FIG. 1 further has the advantage of low standby power dissipation. Low power dissipation in the standby or steady state condition is achieved primarily because when a P-type IGFET is conducting the N-type IGFET associated therewith is non-conducting, and vice versa. Consequently, the load capacitance $C_L$ is charged to one of the two voltage levels. A small amount of power dissipation does occur during the standby condition due to leakage between the source and drain of a cutoff IGFET. However, the leakage current associated therewith is relatively small, i.e., microamperes so that standby power dissipation is negligible.

In addition to the foregoing advantages, the EXCLUSIVE OR/$\overline{\text{EXCLUSIVE OR}}$ requires in the FIG. 1 embodiment no connection to power supply buses. Moreover, the circuit employs only active devices with only four IGFET's required for the illustrated example.

Referring now to FIG. 3, there is shown another signal powered EXCLUSIVE OR/$\overline{\text{EXCLUSIVE OR}}$ circuit requiring only three IGFET's of the same conductivity type. For the sake of convenience, the IGFET's 40, 41 and 42 are all illustrated as being of the P-type conductivity. The IGFET's 40 and 41 are arranged as an inverter having an input terminal 43 and an output terminal 44. To this end, IGFET 40 has its source electrode 40*s* connected to another input terminal 45 and its drain electrode 40*d* connected to the output terminal 44. The gate electrode 40*g* is connected to the inverter input terminal 43. The IGFET 41 is connected in an FET-diode configuration, whereby its source electrode 41*s* is connected to the output terminal 44. The drain electrode 41*d* is connected to a control terminal 55. The gate electrode 41$g$ is connected to a terminal 56.

The transmission gate IGFET 42 has one of its source and drain electrodes 46 connected to the output terminal 44 and the other source-drain electrode 47 connected to the input terminal 43. The gate electrode 48 is connected to the other input terminal 45.

The output terminal 44 also designated as C, is shown to be further connected to a load capacitance 51, also designated $C_L$, as illustrated by the dashed connections in FIG. 3. As in the FIG. 1 embodiment, the load capacitance $C_L$, for example, may be representative of the sum total of the input capacitances of other IGFET's which the logic circuit is driving.

The input terminals 43 and 45 and control terminal 55 are adapted to receive binary input signals A, B and $\overline{B}$, respectively. The terminal 56 may be connected to receive either the $\overline{B}$ signal or to a source of gate bias designated as $-V_g$ in FIG. 3. As in the example of FIG. 1, the binary signals A, B and $\overline{B}$ have the well-known form of HI and LO voltage levels with transitions therebetween as illustrated by the waveform 52 adjacent the B signal. As there illustrated, the HI and LO voltage levels are considered to have values of $V_H$ and $V_L$, respectively. In operation, the HI signal level $V_H$ may conveniently be 0 volt; while the LO signal level $V_L$ may conveniently be $-V_L$ volts where $V_L$ is larger in absolute value than the threshold voltage $V_{TP}$ of either of the IGFET's 40 and 42.

When the B signal is at $V_H=0$ volt, the transmission gate IGFET 42 is turned off so that its source-drain path exhibits a HI impedance or open circuit. The $\overline{B}$ signal is then $-V_L$ volts so that FET-diode 41 is biased into conduction to provide a load impedance for inverting IGFET 40. The IGFET 40 then operates in the common source mode to invert the A signal. Thus when A is HI, C is LO and when A is LO, C is HI.

When the B signal is at $-V_L$ volts, the transmission gate IGFET 42 is turned on so that there is a low impedance path between the A signal input and the C signal output. For this signal condition, the C output signal conditions follow the A signal input, i.e., the load capacitance $C_L$ is charged or discharged to the A signal level via the source-drain path of the transmission gate IGFET 42. Thus when A is HI, C is HI and when A is LO, C is LO. This circuit operation is summarized in the truth table shown in FIG. 4. If the binary symbols "1" and "0" are assigned to the HI and LO levels, respectively (positive logic), the logic circuit functions as an EXCLUSIVE OR gate. On the other hand, if the binary symbols "1" and "0" are assigned to the LO and HI levels, respectively (negative logic), the logic circuit functions as an $\overline{\text{EXCLUSIVE OR}}$ gate.

It should be noted that in the FIG. 3 embodiment the B signal could be replaced with a $\overline{B}$ signal for which case the FIG. 2 truth table is descriptive of the circuit operation.

It should also be noted that for the case where the IGFET 40 is turned on ($A=-V_L$ volts) and operating in the common source mode ($B=V_H=0$ volt), the C output voltage is a function of the ratio of the transconductances ($g_{m41}$ and $g_{m40}$) of IGFET's 41 and 40. Thus, the HI signal level of $V_H$ volt is set substantially equal to zero volt by making $g_{m41}$ much smaller than $g_{m40}$, say by a factor of 10 to 1.

What is claimed is:

1. In combination:

an inverter having an input terminal to which a signal to be inverted may be applied and an output terminal at which the inverted signal is manifested;

a transmission path whose impedance is electronically controllable, connected between the input and output terminals of said inverter;

means responsive to a first input signal manifestation for concurrently placing said transmission path in a high impedance condition and said inverter in an operative state when the signal manifestation represents one value and for concurrently placing said transmission path in its low impedance condition and said inverter in an inoperative state when the signal manifestation represents a second value; and means for applying a second input signal having one of two values to the input terminal of said inverter for transmission through said transmission path or inversion by said inverter, depending on the value of the first input signal manifestation.

2. A logic circuit comprising in combination:

an inverter having an input terminal to which a signal to be inverted may be applied, an output terminal at which the inverted signal is manifested, and control terminal means for placing the inverter in an operative or inoperative state;

a transmission path connected between the input and output terminals of said inverter including control terminal means to which a signal may be applied for changing the conductivity of said path between high and low impedance conditions;

means responsive to an input signal manifestation for applying signals to the control terminal means of said inverter and transmission path for concurrently placing said transmission path in its high impedance condition and said inverter in an operative state when the signal manifestation represents one binary value and for concurrently placing the transmission path in its low impedance condition and the inverter in its inoperative state when the signal manifestation represents the other binary value; and means for applying a signal having a value representing binary one or zero to the input terminal of said inverter for transmission through said transmission path or inversion by said inverter depending upon the binary value represented by said input signal manifestation.

3. The combination claimed in claim 2, said inverter comprising opposite conductivity transistors, each having a source, drain and gate electrode, the gate electrode of one being connected to the gate electrode of the other to form said input terminal of said inverter and the drain electrode of one being connected to the drain electrode of the other to form said output terminal of said inverter, and the respective source electrodes comprising the control terminal means.

4. The combination claimed in claim 2, said transmission path comprising opposite conductivity transistors each having a source and drain electrode, a conduction path extending between said electrodes, and a gate electrode, said two conduction paths being connected in parallel between the input and output terminal of said inverter, and said gate electrodes comprising the control terminal means of said transmission path.

5. The combination claimed in claim 2, said inverter comprising two transistors, each having a source, drain and gate electrode, the drain electrode of one being connected to the source electrode of the other to form the output terminal, and the gate terminal of the one forming the input terminal of said inverter, the source electrode of said one and the drain electrode of the other comprising the control means of said inverter.

6. The combination claimed in claim 2, said transmission path comprising a transistor having source, and drain electrodes defining the ends of a conduction path and a gate electrode, said conduction path being connected between the input and output terminals of said inverter, and the gate electrode comprising the control terminal means of said transmission path.

7. The combination claimed in claim 2, said control terminal means of said inverter comprising two control terminals, and said means responsive to a first input signal manifestation including means for producing a signal and applying it to one of said control terminals and for producing the complement of said signal and applying it to the other of said control terminals.

References Cited

UNITED STATES PATENTS

| | | | |
|---|---|---|---|
| 3,392,341 | 7/1968 | Burns | 307—304 XR |

JOHN S. HEYMAN, Primary Examiner

S. T. KRAWCZEWICZ, Assistant Examiner

U.S. Cl. X.R.

307—205, 218, 251, 304